United States Patent
Ishida et al.

(10) Patent No.: US 11,018,217 B2
(45) Date of Patent: May 25, 2021

(54) SEMICONDUCTOR DEVICE AND METHOD FOR MANUFACTURING THE SAME

(71) Applicant: TOSHIBA MEMORY CORPORATION, Tokyo (JP)

(72) Inventors: Takashi Ishida, Mie (JP); Takahiro Sugimoto, Mie (JP); Hiroshi Kanno, Mie (JP); Tatsuya Okamoto, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/549,826

(22) Filed: Aug. 23, 2019

(65) Prior Publication Data
US 2020/0127081 A1 Apr. 23, 2020

(30) Foreign Application Priority Data
Oct. 17, 2018 (JP) .............................. JP2018-195696

(51) Int. Cl.
| | | |
|---|---|---|
| *H01L 29/04* | (2006.01) | |
| *H01L 21/8234* | (2006.01) | |
| *H01L 27/11556* | (2017.01) | |
| *H01L 27/11582* | (2017.01) | |
| *H01L 27/11568* | (2017.01) | |

(52) U.S. Cl.
CPC ...... *H01L 29/04* (2013.01); *H01L 21/823487* (2013.01); *H01L 27/11556* (2013.01); *H01L 27/11582* (2013.01)

(58) Field of Classification Search
CPC ............. H01L 29/04; H01L 21/823487; H01L 27/11556; H01L 27/11582
See application file for complete search history.

(56) References Cited

U.S. PATENT DOCUMENTS

| | | | |
|---|---|---|---|
| 5,220,530 A | 6/1993 | Itoh | |
| 6,040,605 A | 3/2000 | Sano et al. | |
| 7,826,266 B2 | 11/2010 | Ishii | |
| 2014/0117366 A1* | 5/2014 | Saitoh | H01L 27/088 257/64 |
| 2017/0047343 A1* | 2/2017 | Lee | H01L 27/11529 |
| 2017/0207226 A1* | 7/2017 | Lee | H01L 27/11582 |
| 2018/0076213 A1* | 3/2018 | Kaneko | H01L 27/11556 |

FOREIGN PATENT DOCUMENTS

| | | |
|---|---|---|
| JP | H10135414 A | 5/1998 |
| JP | 2004328005 A | 11/2004 |

* cited by examiner

*Primary Examiner* — Herve-Louis Y Assouman
(74) *Attorney, Agent, or Firm* — Kim & Stewart LLP

(57) ABSTRACT

A semiconductor device includes a first semiconductor layer that is an electrically-conductive polycrystalline semiconductor layer and a second semiconductor layer on the first semiconductor layer. The second semiconductor layer is an electrically-conductive polycrystalline semiconductor layer having a smaller average grain size than the first semiconductor layer. A plurality of electrode layers are stacked on the second semiconductor layer at intervals in a first direction. A third semiconductor layer extends in the first direction through the first semiconductor layer, the second semiconductor layer, and each of the electrode layers and contacts the second semiconductor layer. A charge storage layer is between the plurality of electrode layers and the third semiconductor layer.

12 Claims, 13 Drawing Sheets

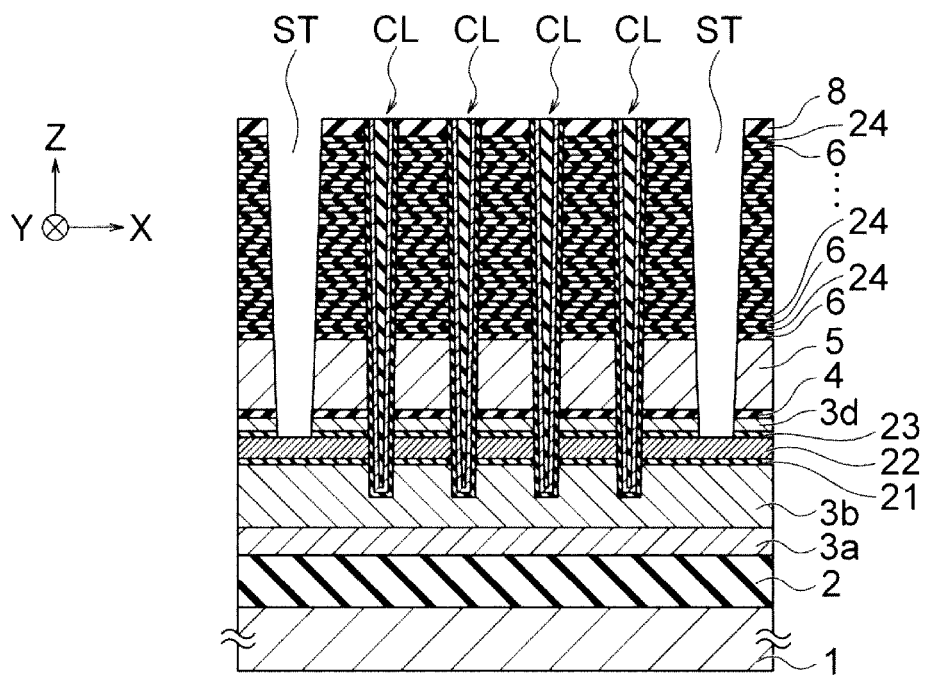
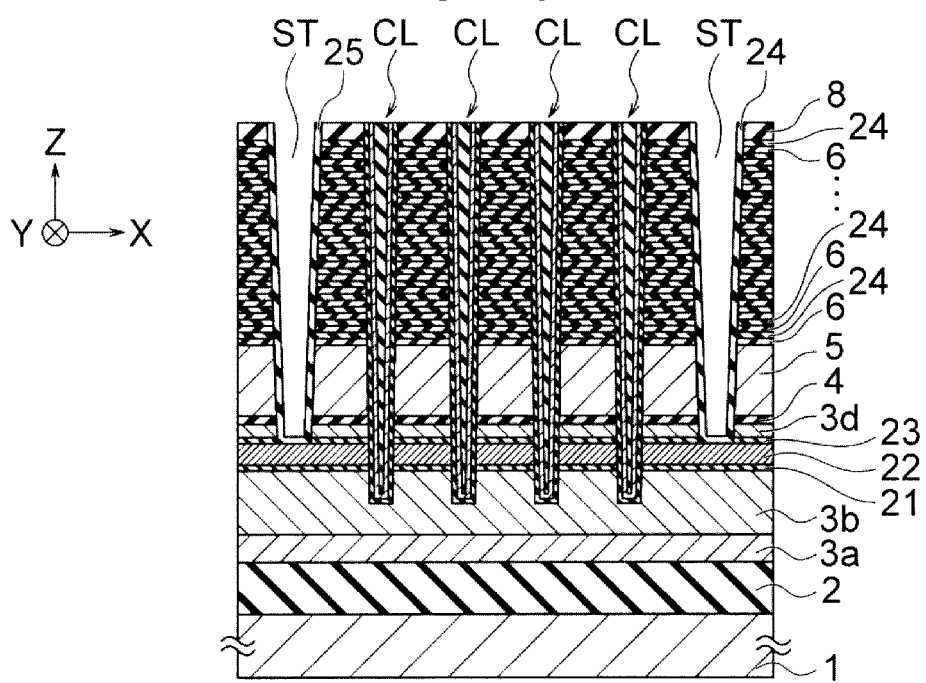

SEMICONDUCTOR DEVICE AND METHOD FOR MANUFACTURING THE SAME

CROSS-REFERENCE TO RELATED APPLICATION(S)

This application is based upon and claims the benefit of priority from Japanese Patent Application No. 2018-195696, filed Oct. 17, 2018, the entire contents of which are incorporated herein by reference.

FIELD

Embodiments described herein relate generally to a semiconductor device and a method for manufacturing the same.

BACKGROUND

In the formation of a semiconductor layer, for example an interconnect layer or source layer that is to be in contact with a channel layer in a semiconductor memory device, it is sometimes desirable to make crystal grains in such a semiconductor layer to be small in size.

DESCRIPTION OF THE DRAWINGS

FIGS. 3 to 16 are cross-sectional views illustrating aspects of a manufacturing method of a semiconductor device according to a first embodiment.

DETAILED DESCRIPTION

In general, according to one embodiment, a semiconductor device includes a first semiconductor layer that is an electrically-conductive polycrystalline semiconductor layer, a second semiconductor layer on the first semiconductor layer and that is an electrically-conductive polycrystalline semiconductor layer having a smaller average grain size than the first semiconductor layer. A plurality of electrode layers are stacked on the second semiconductor layer at intervals in a first direction. A third semiconductor layer extends in the first direction through the first semiconductor layer, the second semiconductor layer, and each of the electrode layers and contacts the second semiconductor layer. A charge storage layer is between the plurality of electrode layers and the third semiconductor layer.

Example embodiments of the present disclosure will now be described with reference to the drawings. In FIGS. 1 through 24, the same reference symbols are used for the same or substantially similar aspects, and a duplicated description thereof may be omitted.

First Embodiment

Figure 1:
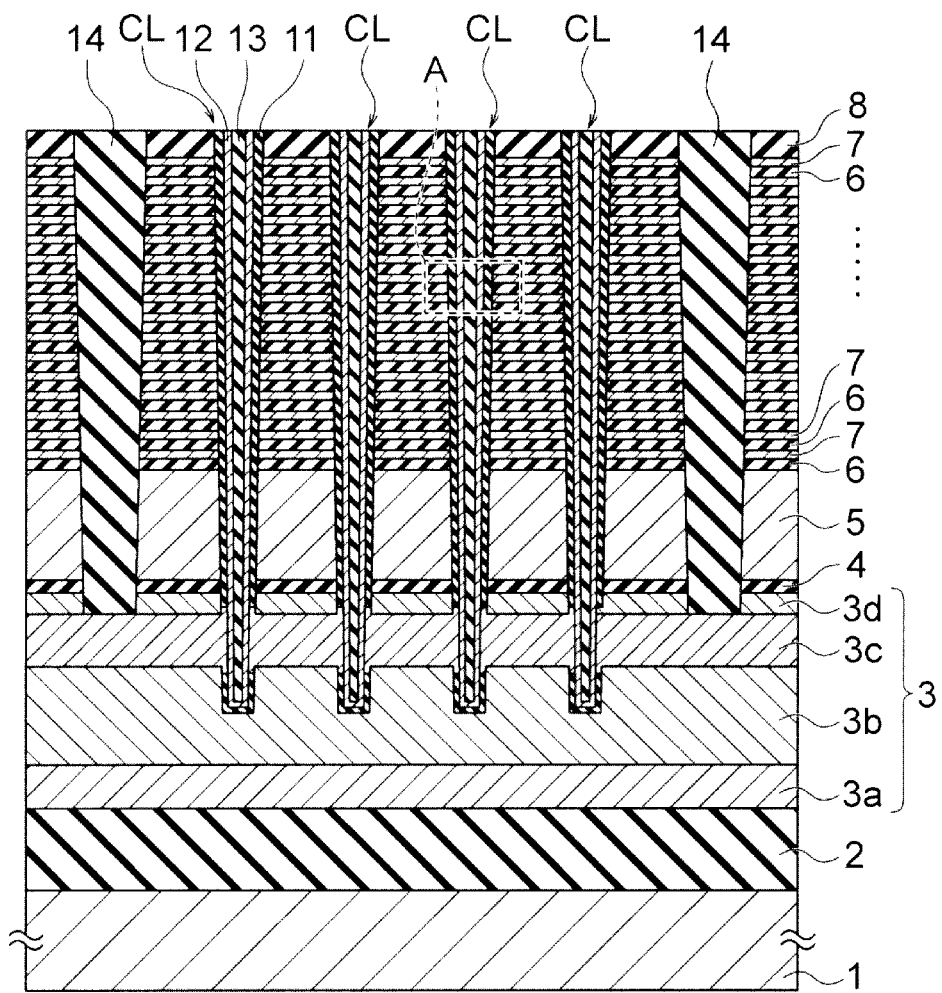
FIG. 1 is a cross-sectional view of a semiconductor device according to a first embodiment.

FIG. 1 is a cross-sectional view showing the structure of a semiconductor device according to a first embodiment. The semiconductor device of FIG. 1 is, for example, a three-dimensional memory device.

The semiconductor device of FIG. 1 includes a substrate 1, a first interlayer insulating film 2, a source layer 3, a second interlayer insulating film 4, a gate layer 5, a plurality of insulating layers 6, a plurality of electrode layers 7, a third interlayer insulating film 8, a memory insulating film 11, a channel semiconductor layer 12, a core insulating film 13, and a plurality of element isolation insulating films 14.

The substrate 1 is, for example, a semiconductor substrate such as a silicon substrate. FIG. 1 shows an X direction and a Y direction which are parallel to the surface of the substrate 1 and perpendicular to each other, and a Z direction orthogonal to the surface of the substrate 1. A +Z direction is herein referred to as an upward direction, and a −Z direction is referred to as a downward direction. The −Z direction may or may not coincide with the direction of gravitational force. The Z direction is an example of a first direction.

The first interlayer insulating film 2, the source layer 3, the second interlayer insulating film 4 and the gate layer 5 are formed in this order on the substrate 1. The first interlayer insulating film 2 is, for example, a silicon oxide film or a silicon nitride film. The source layer 3 includes a metal layer 3a, a lower semiconductor layer 3b, an intermediate semiconductor layer 3c, and an upper semiconductor layer 3d, which are formed in this order on the first interlayer insulating film 2. The metal layer 3a is, for example, a tungsten layer or a tungsten silicide layer. The lower semiconductor layer 3b, the intermediate semiconductor layer 3c and the upper semiconductor layer 3d are, for example, electrically-conductive polycrystalline semiconductor layers, also referred to as polysilicon layers. The second interlayer insulating film 4 is, for example, a silicon oxide film or a silicon nitride film. The gate layer 5 is, for example, a polysilicon layer.

The insulating layers 6 and the electrode layers 7 are formed alternately on the gate layer 5 and forma stacked film. The third interlayer insulating film 8 is formed on this stacked film. The insulating layers 6 are, for example, silicon oxide films. The electrode layers 7 are, for example, tungsten layers. The third interlayer insulating film 8 is, for example, a silicon oxide film. In general, each insulating layer 6 is formed between two adjacent electrode layers 7; thus, the electrode layers 7 are stacked one on the other in the Z direction with an insulating layer 6 disposed between adjacent electrode layers 7. In some examples, the insulating layers 6 may be replaced with air gaps or themselves be air gaps.

FIG. 1 shows a plurality of columnar portions CL formed such that they penetrate the third interlayer insulating film 8, the electrode layers 7, the insulating layers 6, the gate layer 5, the second interlayer insulating film 4, the upper semiconductor layer 3d, and the intermediate semiconductor layer 3c. The columnar portions CL each have a columnar shape extending in the Z direction. Each columnar portion CL includes a memory insulating film 11, a channel semiconductor layer 12, and a core insulating film 13 which are formed in this order on the surfaces of the third interlayer insulating film 8, the electrode layers 7, the insulating layers 6, the gate layer 5, the second interlayer insulating film 4, the upper semiconductor layer 3d, the intermediate semiconductor layer 3c and the lower semiconductor layer 3b. The channel semiconductor layer 12 is in contact with and electrically connected to the intermediate semiconductor layer 3c.

Figure 2:
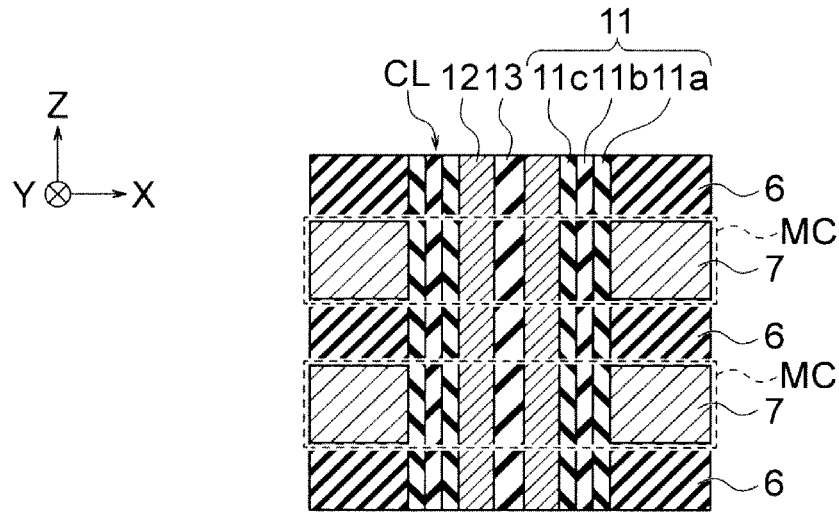
FIG. 2 is an enlarged cross-sectional view of a semiconductor device according to a first embodiment.

As shown in FIG. 2, the memory insulating film 11 includes a block insulating film 11a, a charge storage layer 11b and a tunnel insulating film 11c, in this order outward from the surfaces of the electrode layers 7 and the insulating layers 6. FIG. 2 is an enlarged cross-sectional view showing the area A depicted in FIG. 1. The block insulating film 11a is, for example, a silicon oxide film. The charge storage layer 11b is, for example, a silicon nitride film. The charge storage layer 11b may not be an insulating film but be, for example, a polysilicon layer. The tunnel insulating film 11c is, for example, a silicon oxide film. The channel semiconductor layer 12 is, for example, an electrically-conductive polycrystalline semiconductor layer, in particular a polysilicon layer. The core insulating film 13 is, for example, a silicon oxide film. Each electrode layer 7, together with the columnar portion CL, forms a memory cell MC and functions as a word line. The channel semiconductor layer 12 is formed along the sides of the electrode layers 7 via the charge storage layer 11b.

FIG. 1 also shows a plurality of element isolation insulating films 14 formed such that they penetrate the third interlayer insulating film 8, the electrode layers 7, the insulating layers 6, the gate layer 5, the second interlayer insulating film 4, and the upper semiconductor layer 3d. The element isolation insulating films 14 each have a plate-like shape extending in the Y direction. The element isolation insulating films 14 are, for example, silicon oxide films.

FIGS. 3 through 16 are cross-sectional views illustrating a manufacturing method of a semiconductor device according to the first embodiment.

Figure 3:
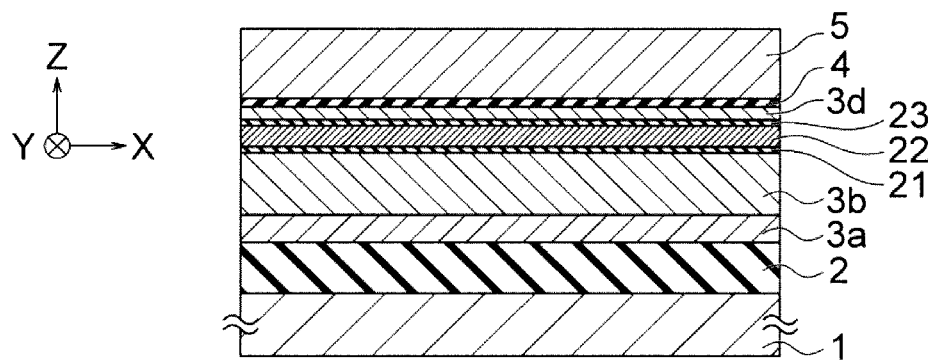

First, a first interlayer insulating film 2, a metal layer 3a, a lower semiconductor layer 3b, a first protective film 21, a sacrificial layer 22, a second protective film 23, an upper semiconductor layer 3d, a second interlayer insulating film 4, and a gate layer 5 are sequentially formed on a substrate 1 (FIG. 3). The first protective film 21 is, for example, a silicon oxide film. The sacrificial layer 22 is, for example, a polysilicon layer. The second protective film 23 is, for example, a silicon oxide film. The first protective film 21, the sacrificial layer 22 and the second protective film 23 are examples of a first film.

Figure 4:
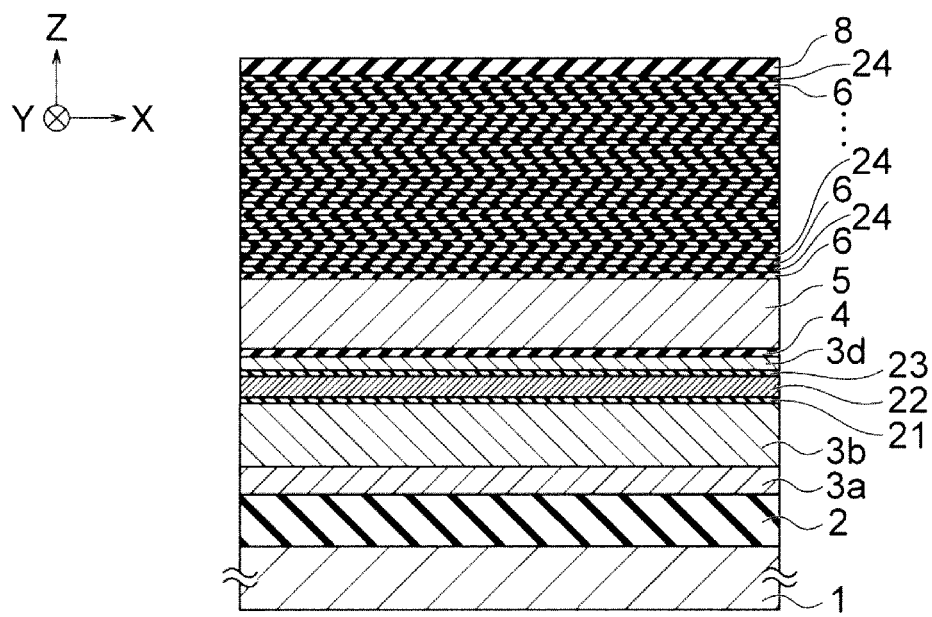
Figure 5:
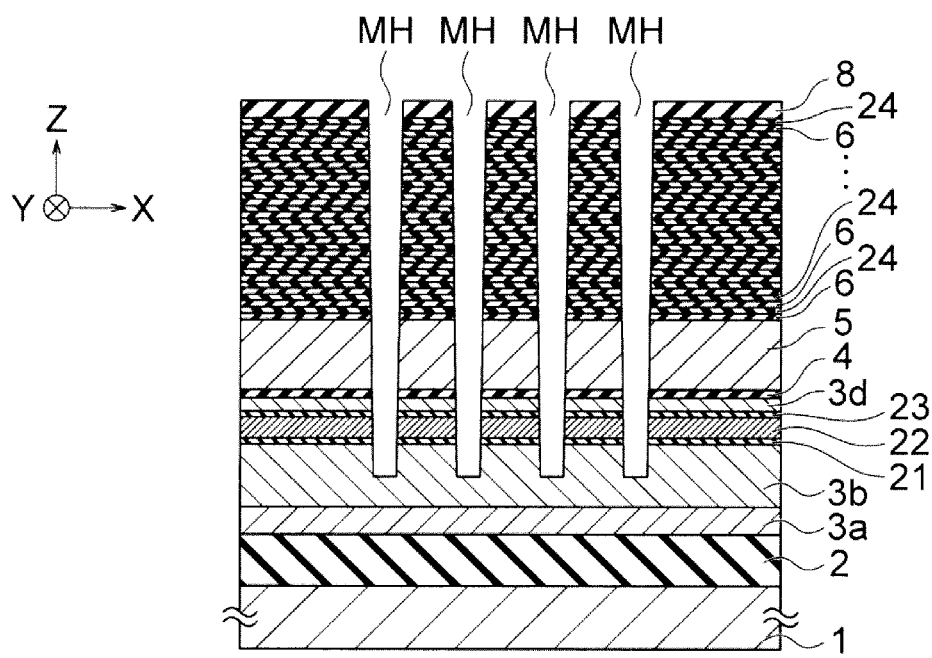

Next, in the process step of FIG. 4, a plurality of insulating layers 6 and a plurality of sacrificial layers 24 are formed alternately on the gate layer 5, and a third interlayer insulating film 8 is formed on the insulating layers 6 and the sacrificial layers 24 (FIG. 4). The sacrificial layers 24 are, for example, silicon nitride films. The sacrificial layers 24 are eventually replaced with electrode layers 7 later in the manufacturing process. In some example process flows, the electrode layers 7 may be formed directly at this stage instead of the sacrificial layers 24.

Next, a plurality of memory holes MH, penetrating the third interlayer insulating film 8, the sacrificial layers 24, the insulating layers 6, the gate layer 5, the second interlayer insulating film 4, the upper semiconductor layer 3d, the second protective film 23, the sacrificial layer 22, and the first protective film 21, are formed by lithography and RIE (Reactive Ion Etching).

Figure 6:
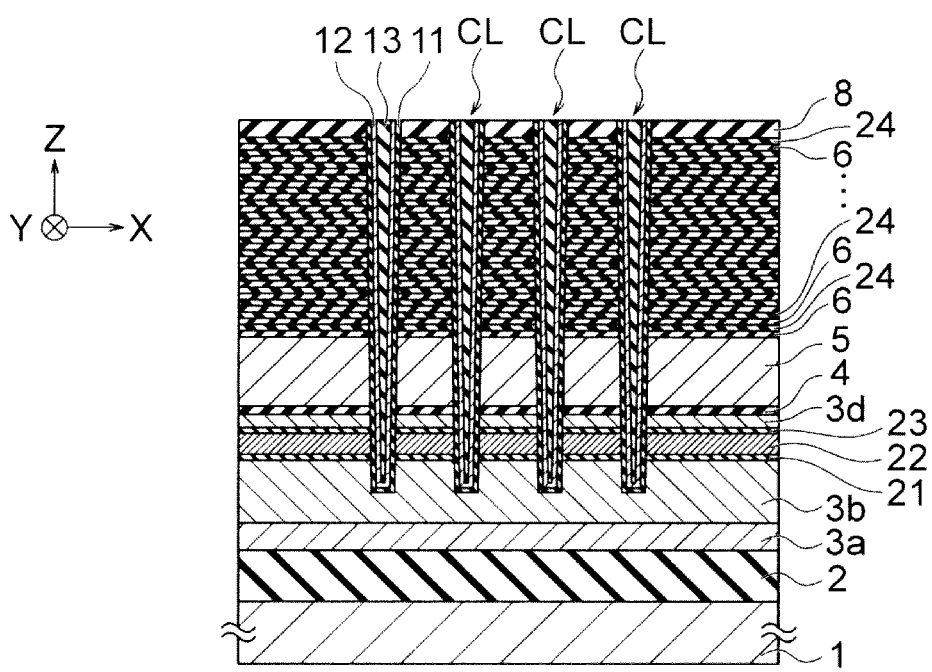

Next, a memory insulating film 11, a channel semiconductor layer 12 and a core insulating film 13 are sequentially formed in each of the memory holes MH (FIG. 6). As a result, a plurality of columnar portions CL are formed in the memory holes MH. The memory insulating film 11 is formed by forming the block insulating film 11a, charge storage layer 11b, and tunnel insulating film 11c in each memory hole MH.

Figure 7:
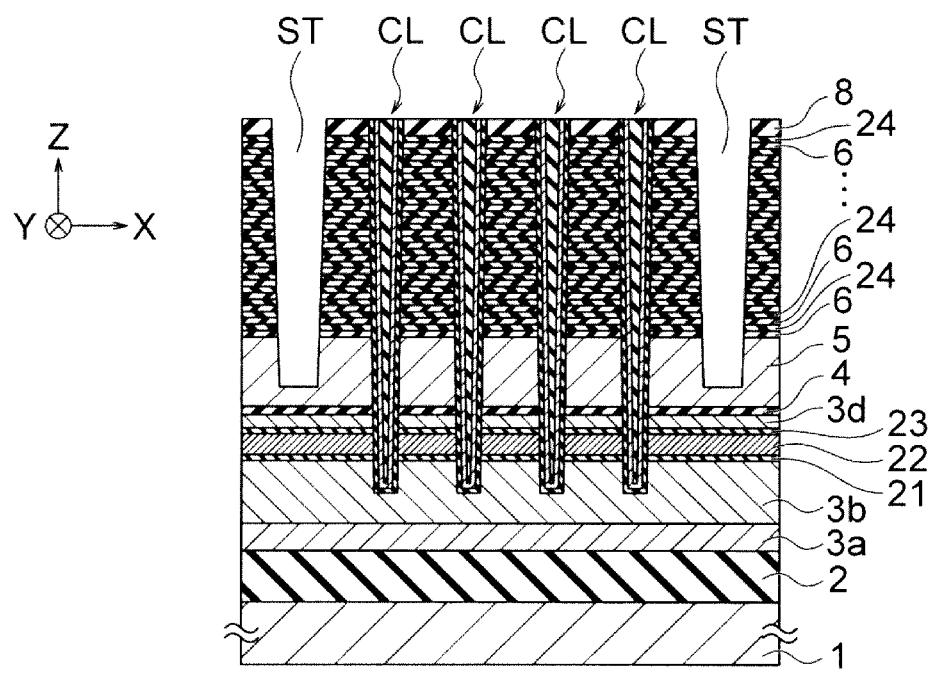
Figure 8:
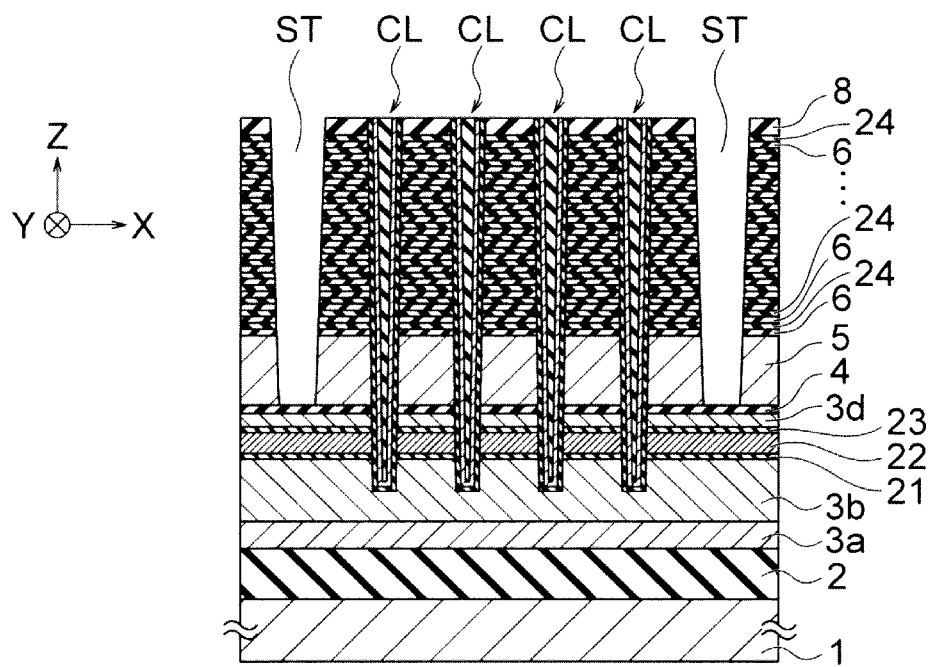

Next, a plurality of element isolation trenches ST, penetrating the third interlayer insulating film 8, the sacrificial layers 24, the insulating layers 6, and the gate layer 5, are formed by lithography and RIE (FIGS. 7 and 8). In this example, RIE is performed by using a first etching gas until the trenches are etched to the state illustrated in FIG. 7, and then etching using a second etching gas, which is different from the first etching gas, is performed.

Figure 11:
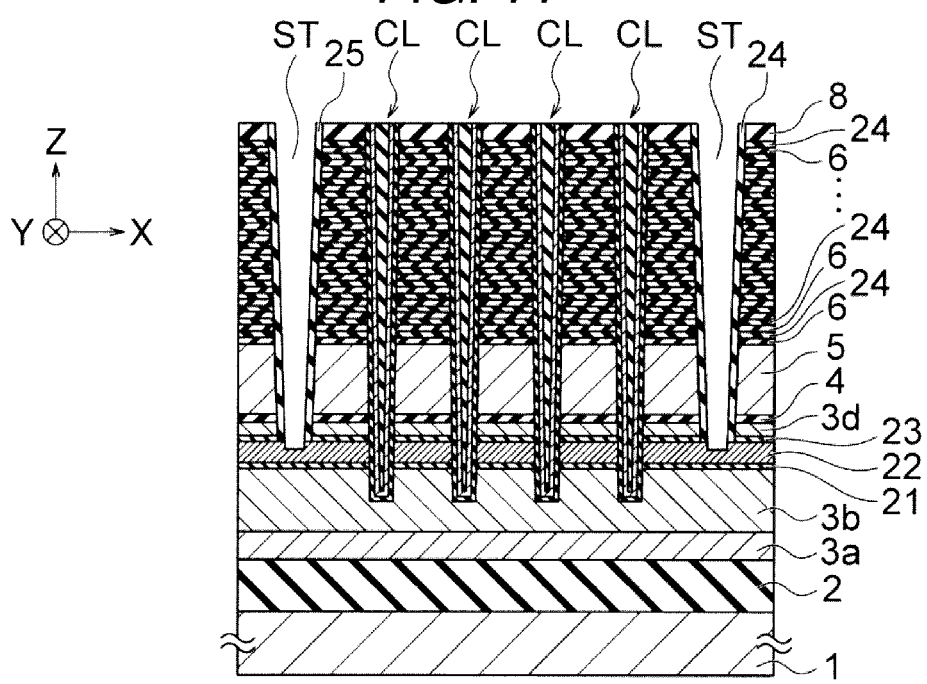

Next, the second protective film 23 is etched away at the bottom of each element isolation trench ST (FIG. 9), and then a liner layer 25 is formed on the surface of the element isolation trench ST (FIG. 10), and subsequently the liner layer 25 is etched away at the bottom of the element isolation trench ST (FIG. 11). As a result, while the side surface of the element isolation trench ST is covered by the liner layer 25, the sacrificial layer 22 is exposed at the bottom surface of the element isolation trench ST. The liner layer 25 is, for example, a silicon nitride film.

Figure 12:
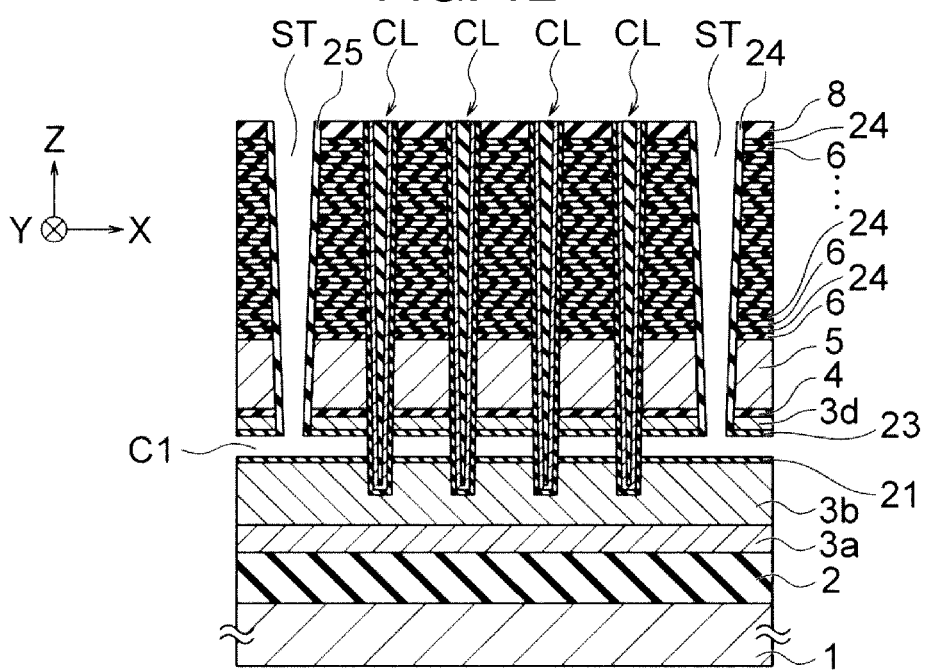
Figure 13:
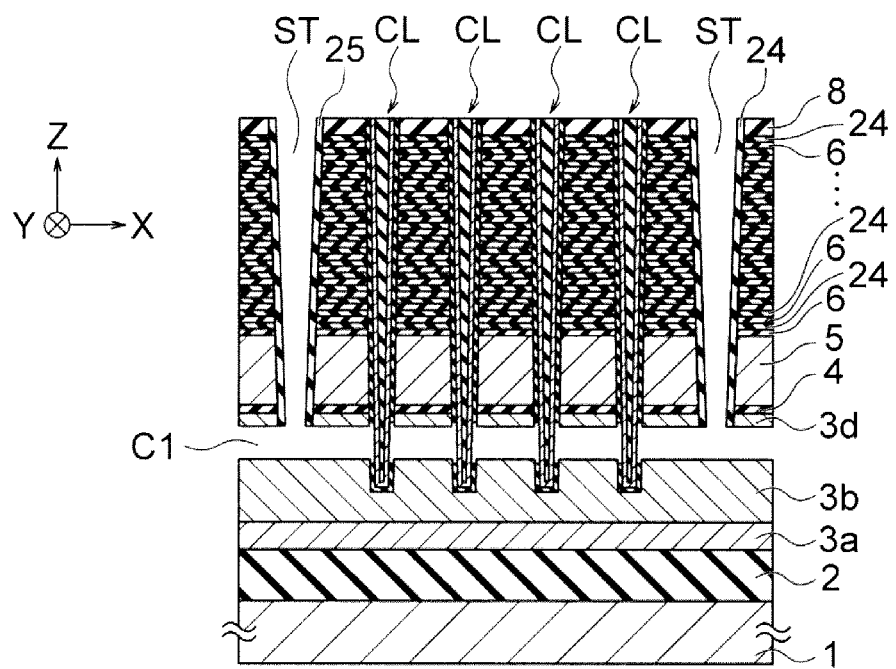

Next, the sacrificial layer 22 is removed by wet etching in which wet etchant passes through the element isolation trenches ST (FIG. 12). As a result, a cavity C1 is formed between the first protective film 21 and the second protective film 23, and the memory insulating film 11 is exposed at the side surfaces of the cavity C1. The cavity C1 may also be referred to as an air gap.

Next, the first protective film 21, the second protective film 23, and the memory insulating film 11 exposed at the side surfaces of the cavity C1 are removed by CDE (Chemical Dry Etching) using the element isolation trenches ST (FIG. 13) as a passage for the dry etchant. As a result, the upper semiconductor layer 3d becomes exposed at the upper surface of the cavity C1, the lower semiconductor layer 3b at the lower surface of the cavity C1, and the channel semiconductor layer 12 at the side surfaces of the cavity C1.

Figure 14:
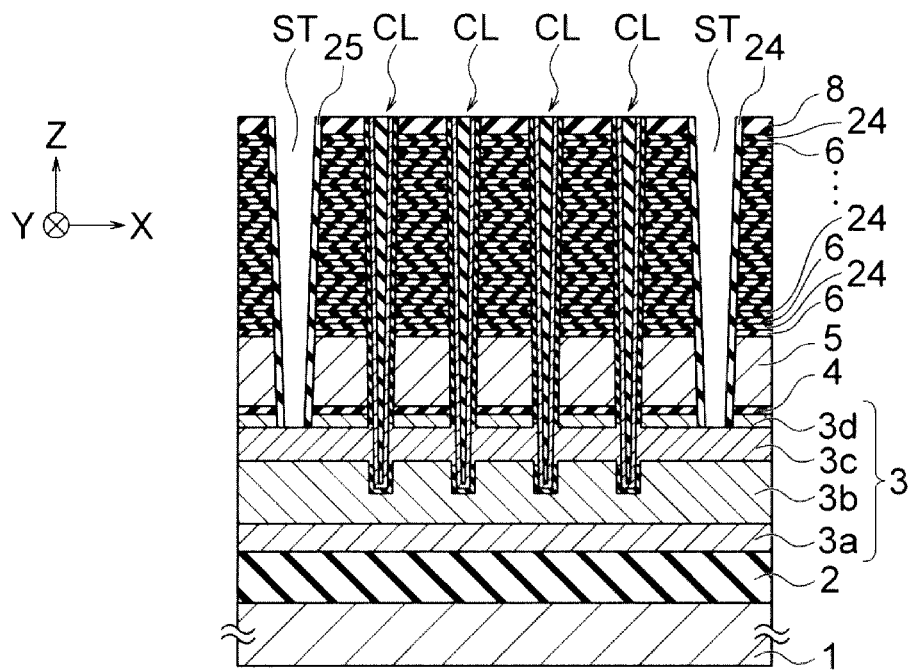

Next, an intermediate semiconductor layer 3c is formed in the cavity C1 by forming it on the surfaces of the upper semiconductor layer 3d, the lower semiconductor layer 3b and the channel semiconductor layer 12, exposed in the cavity C1 (FIG. 14). As a result, the intermediate semiconductor layer 3c, which is in contact with the upper semiconductor layer 3d, the lower semiconductor layer 3b, and the channel semiconductor layer 12, is formed between the upper semiconductor layer 3d and the lower semiconductor layer 3b. A particular example method for forming the intermediate semiconductor layer 3c as depicted in FIG. 14 according to this embodiment, will be described further below.

Figure 15:
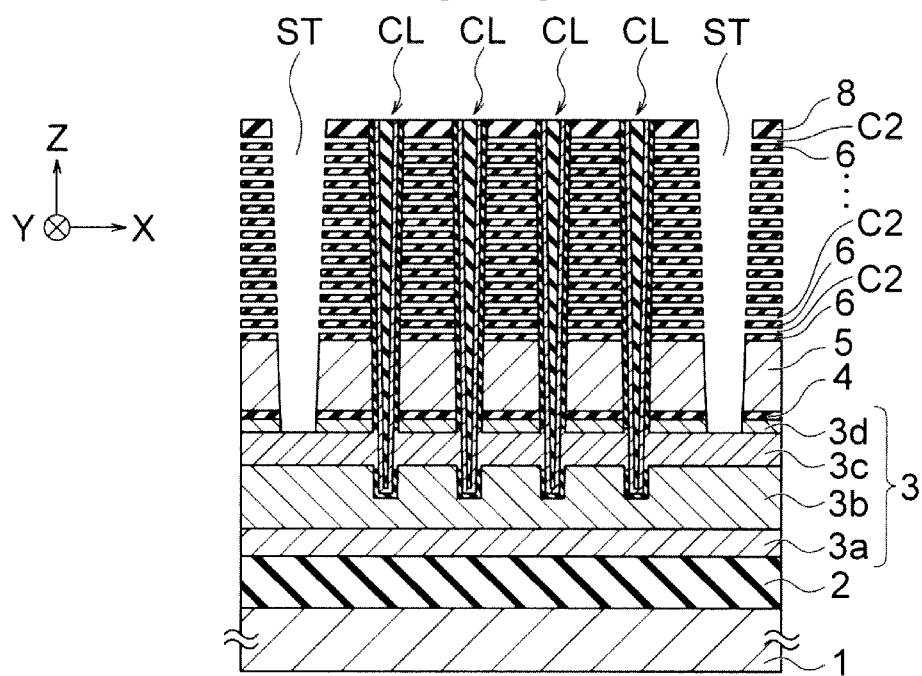

Next, the liner layer 25 in each element isolation trench ST and the sacrificial layers 24 between the insulating layers 6 are removed by wet etching or dry etching (FIG. 15). As a result, a plurality of cavities C2 are formed between the insulating layers 6. The cavities C2 may be referred to as air gaps.

Figure 16:
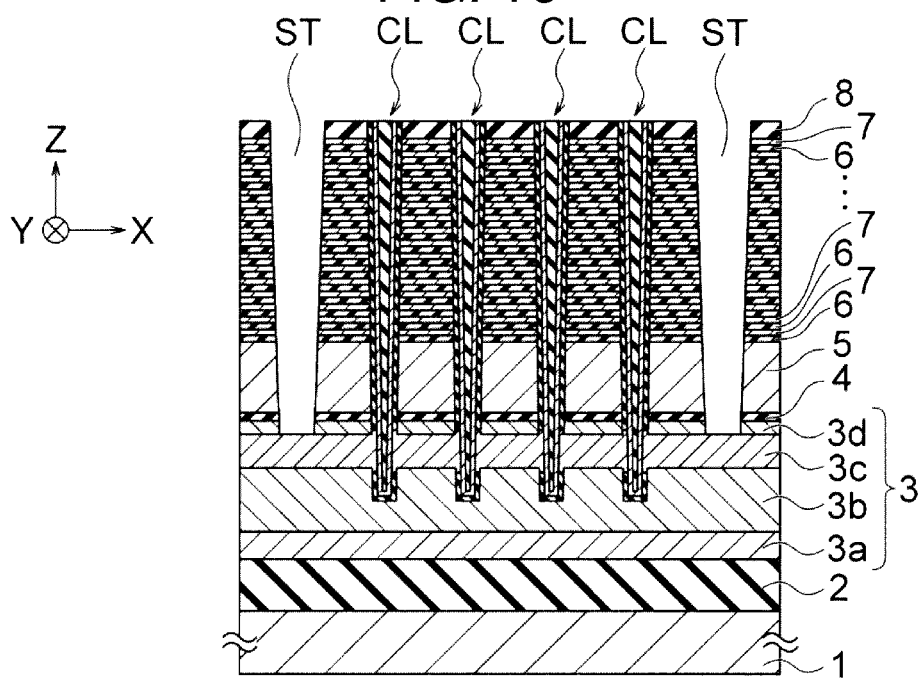

Next, a plurality of electrode layers 7 are formed in the cavities C2 by CVD (Chemical Vapor Deposition) (FIG. 16). As a result, a film stack including the alternating layer of insulating layers 6 and electrode layers 7 is formed between the gate layer 5 and the third interlayer insulating film 8.

Thereafter, element isolation insulating films 14 are formed in the element isolation trenches ST. Furthermore, various plugs, interconnects, interlayer insulating films, etc. are formed on the substrate 1. The semiconductor device shown in 1 is thus manufactured.

Figure 17:
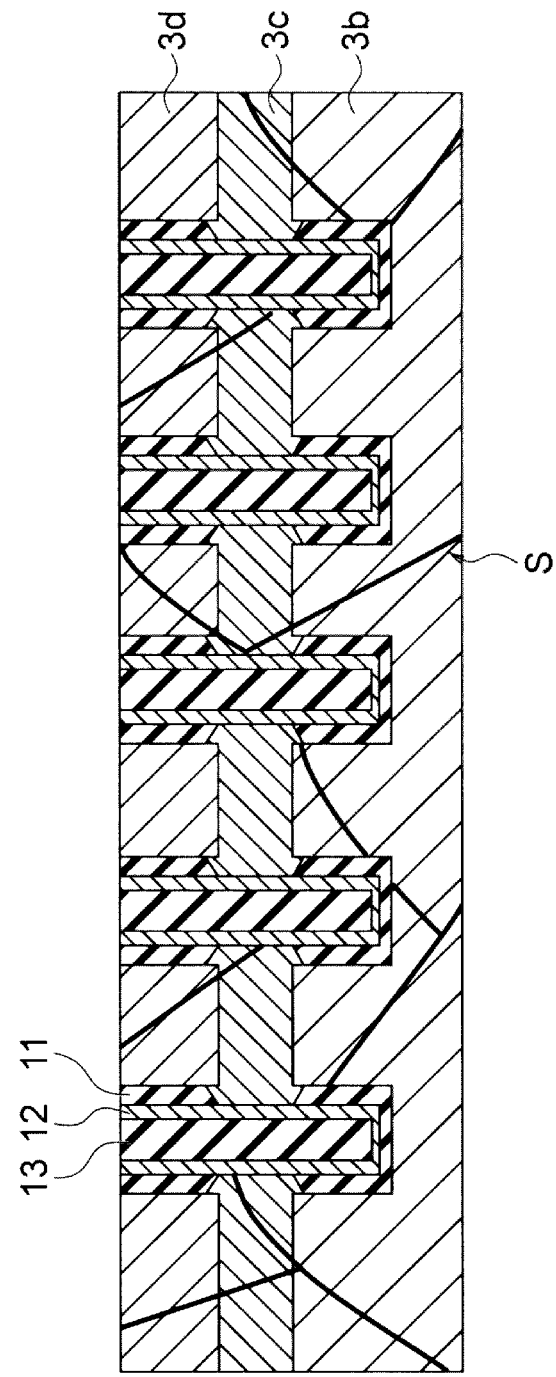
FIG. 17 is a cross-sectional view depicting grain boundaries according to a comparative example.

FIG. 17 is a cross-sectional view illustrating grain boundaries in the first embodiment.

FIG. 17 shows the lower semiconductor layer 3b, the intermediate semiconductor layer 3c, and the upper semiconductor layer 3d. In this embodiment, the lower semiconductor layer 3b, the intermediate semiconductor layer 3c, and the upper semiconductor layer 3d are each polysilicon layers containing a large number of crystal grains.

In particular, the lower semiconductor layer 3b and the upper semiconductor layer 3d of this embodiment are formed in such a manner as to have a large size of crystal grains. This enables the lower semiconductor layer 3b and the upper semiconductor layer 3d to have a low resistance. In general, standard fabrication methods and conditions provide large size crystal grains in this context.

The intermediate semiconductor layer 3c of this embodiment is formed on the surfaces of the already formed upper semiconductor layer 3d and the lower semiconductor layer 3b (see FIG. 14). If the intermediate semiconductor layer 3c is formed by a standard method, the grain size of the upper semiconductor layer 3d and the grain size of the lower semiconductor layer 3b will affect the grain size of the intermediate semiconductor layer 3c formed thereon. That is, the intermediate semiconductor layer 3c will also be formed such that it has a large size of crystal grains corresponding to those of the already formed upper semiconductor layer 3d and the lower semiconductor layer 3b.

FIG. 17 schematically shows an example of grain boundaries S which will be formed when the intermediate semiconductor layer 3c is formed by a standard method. When the crystal grains in the various semiconductor layers have a large size, the grain boundaries S will be formed sparsely in the layers. Consequently, areas at the surface of the channel semiconductor layers 12 will exist which are in contact with (or close) to a grain boundary S and also areas which are remote from a grain boundary S. It is considered possible that the properties of the channel semiconductor layer 12 and the properties of the intermediate semiconductor layer 3c may differ significantly between the former areas (near or in contact with a grain boundary S) and the latter areas (distant from a grain boundary S), resulting in deterioration of the performance of the semiconductor device. For example, variation in the diffusion of phosphorus atoms used as a dopant can vary between these different area types.

In view of this, in the present embodiment, the intermediate semiconductor layer 3c is formed in such a manner as to have a small size of crystal grains. This makes it possible to prevent the phenomena that might be caused by differences in the presence/concentration of grain boundaries S.

Figure 18:
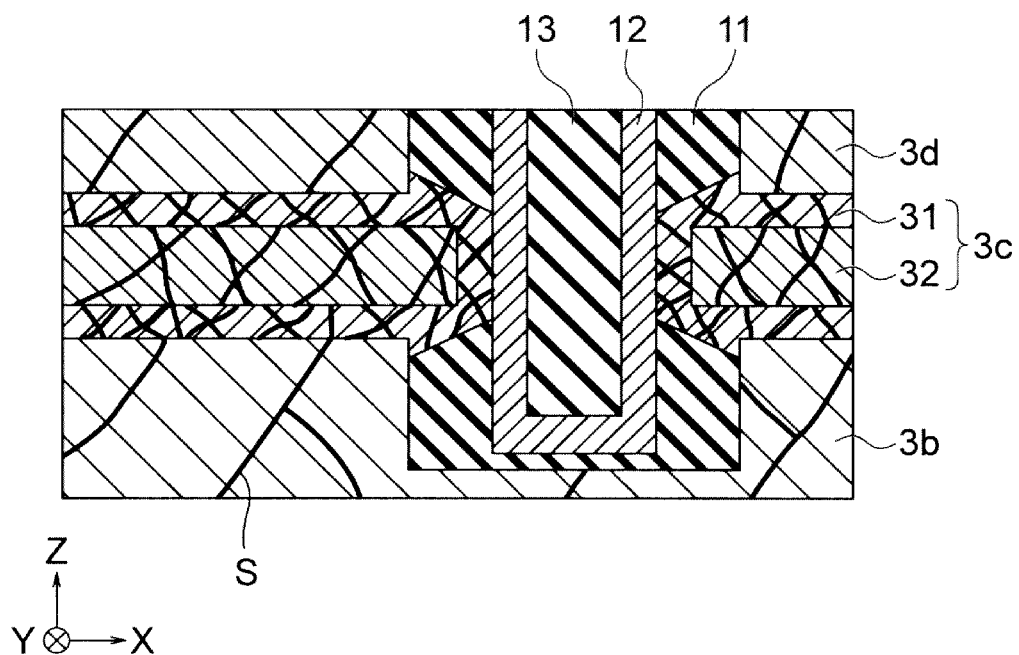
FIG. 18 is a cross-sectional view depicting aspects of a semiconductor device according to a first embodiment.

FIG. 18 is a cross-sectional view showing the structure of a semiconductor device of the first embodiment. FIG. 18 shows the lower semiconductor layer 3b, the intermediate semiconductor layer 3c, and the upper semiconductor layer 3d with grain boundaries S depicted therein.

The lower semiconductor layer 3b and the upper semiconductor layer 3d of this embodiment are polysilicon layers containing dopant atoms such as B (boron), P (phosphorus), As (arsenic), etc; and also potentially containing impurity atoms other than the intended dopant atoms. The impurity atoms other than the dopant atoms are, for example, C (carbon) atoms or N (nitrogen) atoms. For example, the lower semiconductor layer 3b and the upper semiconductor layer 3d each contain P atoms and C atoms (or N atoms), and the average concentration of C atoms (or N atoms) in each of the lower semiconductor layer 3b and the upper semiconductor layer 3d is less than $1.4 \times 10^{21}/cm^3$ (e.g. about $4.0 \times 10^{20}/cm^3$).

The lower semiconductor layer 3b and the upper semiconductor layer 3d of this embodiment are formed in such a manner as to have a large crystal grain. The average size of crystal grains in each of the lower semiconductor layer 3b and the upper semiconductor layer 3d of this embodiment is more than 100 nm, for example, about 300 nm in some examples. Because of the large size of crystal grains, grain boundaries S are formed sparsely in the lower semiconductor layer 3b and the upper semiconductor layer 3d of this embodiment.

However, the intermediate semiconductor layer 3c includes a small-grain size layer 31 and a medium-grain size layer 32. The small-grain size layer 31 is formed between the lower semiconductor layer 3b and the upper semiconductor layer 3d, and on the upper surface of the lower semiconductor layer 3b, the lower surface of the upper semiconductor layer 3d, the side surface of the channel semiconductor layer 12, etc. The medium-grain size layer 32 is formed between the lower semiconductor layer 3b and the upper semiconductor layer 3d via the small-grain size layer 31. In other words, the small-grain size layer 31 is formed between the lower surface of the medium-grain size layer 32 and the upper surface of the lower semiconductor layer 3b, between the upper surface of the medium-grain size layer 32 and the lower surface of the upper semiconductor layer 3d, between the side surface of the medium-grain size layer 32 and the side surface of the channel semiconductor layer 12, etc.

The intermediate semiconductor layer 3c of this embodiment is thus formed in such a manner as to have a smaller size of crystal grains as compared to the lower semiconductor layer 3b and the upper semiconductor layer 3d. Therefore, the grain boundaries S, formed in the intermediate semiconductor layer 3c, are denser than the grain boundaries S formed in the lower semiconductor layer 3b and the upper semiconductor layer 3d. Further, the medium-grain size layer 32 is formed in such a manner as to have a larger size of crystal trains as compared to the small-grain size layer 31. Therefore, the grain boundaries S, formed in the medium-grain size layer 32, are sparser than the grain boundaries S formed in the small-grain size layer 31. The average size of crystal grains in the small-grain size layer 31 of this embodiment is less than 50 nm, for example about 20 nm. The average size of crystal grains in the medium-grain size layer 32 of this embodiment is more than 50 nm and less than 100 nm, for example about 70 nm.

The small-grain size layer 31 of this embodiment is a polysilicon layer containing dopant atoms such as B atoms, P atoms, As atoms, etc., and also containing impurity atoms other than the dopant atoms. The impurity atoms other than the dopant atoms are, for example, C atoms or N atoms. For example, the small-grain size layer 31 contains P atoms and C atoms (or N atoms), and the average concentration of C atoms (or N atoms) in the small-grain size layer 31 is more than $1.4 \times 10^{21}/cm^3$ (e.g. about $2.0 \times 10^{21}/cm^3$). In this first embodiment, the size of crystal grains in the small-grain size layer 31 is made small by forming the small-grain size layer 31 in such a manner as to contain a high concentration of C atoms (or N atoms).

The medium-grain size layer 32 of this first embodiment is a polysilicon layer containing dopant atoms such as B atoms, P atoms, As atoms, etc., and containing no or only a slight amount of impurity atoms other than the dopant atoms. For example, the medium-grain size layer 32 contains P atoms and contains no or only a slight amount of C atoms (or N atoms), such that the average concentration of C atoms (or N atoms) in the medium-grain size layer 32 is less than $1.4 \times 10^{21}/cm^3$, for example almost zero. Though the medium-grain size layer 32 of this first embodiment does not contain a high concentration of C atoms (or N atoms), it is formed on the surface of the small-grain size layer 31 as will be described below. Accordingly, while the size of crystal grains in the medium-grain size layer 32 is not as small as the size of crystal grains in the small-grain size layer 31, it is typically smaller than the size of crystal grains in the lower semiconductor layer 3b and the upper semiconductor layer 3d due to the influence of the small-grain size layer 31.

The average size of crystal grains in the channel semiconductor layer 12 of this first embodiment is, for example, about 100 nm. Thus, in this first embodiment, the average size of crystal grains in each of the lower semiconductor layer 3b and the upper semiconductor layer 3d is larger than the average size of crystal grains in the channel semiconductor layer 12, while the average size of crystal grains in each of the small-grain size layer 31 and the medium-grain size layer 32 is smaller than the average size of crystal grains in the channel semiconductor layer 12.

Figure 19:
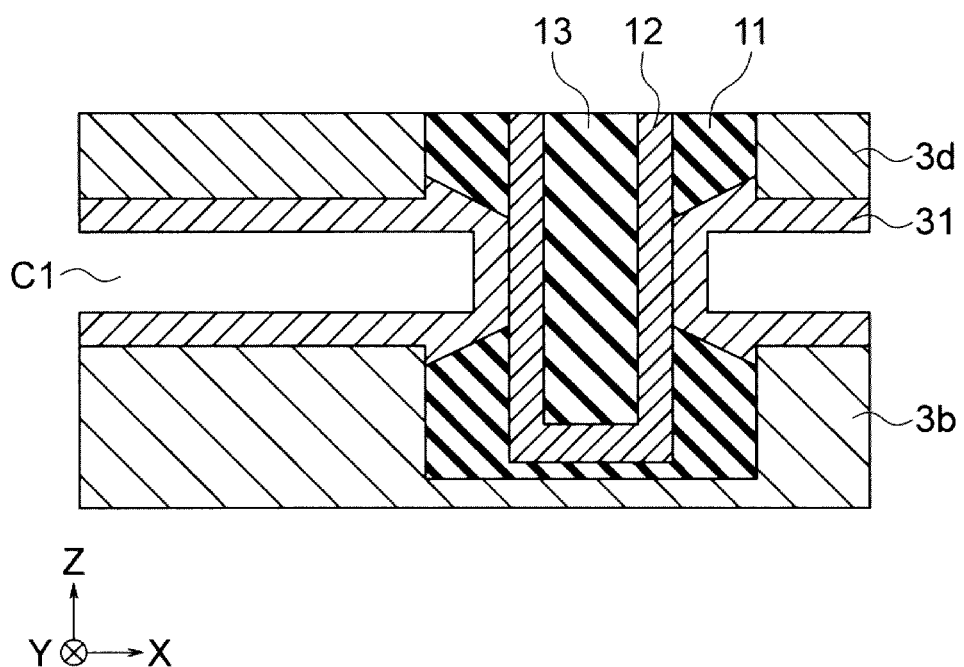
FIG. 19 is a cross-sectional view illustrating aspects of a manufacturing method for a semiconductor device according to a first embodiment.

FIG. 19 is a cross-sectional view illustrating a manufacturing method for the semiconductor device according to the first embodiment.

First, the process steps of FIGS. 3 through 13 are performed. The lower semiconductor layer 3b and the upper semiconductor layer 3d are formed in such a manner as to contain dopant atoms and a low concentration of impurity atoms other than the dopant atoms. The lower semiconductor layer 3b and the upper semiconductor layer 3d are thus formed which have crystal grains having an average size of more than 100 nm.

Next, a small-grain size layer 31 is formed on the surface in the cavity C1 by forming it on the surfaces of the upper semiconductor layer 3d, the lower semiconductor layer 3b, etc. (FIG. 19). The small-grain size layer 31 is formed in such a manner so as to contain dopant atoms and a high concentration of impurity atoms other than the dopant atoms. This forms a small-grain size layer 31 which contains crystal grains having an average size of less than 50 nm. For example, the small-grain size layer 31 is formed in such a manner as to have an average C-atom concentration of more than $1.4 \times 10^{21}/cm^3$.

Next, a medium-grain size layer 32 is formed in the cavity C1 by forming it on the surface of the small-grain size layer 31. The structure shown in FIG. 18 is thus produced. The medium-grain size layer 32 is formed in such a manner as to contain dopant atoms but contain no or only a slight amount of other impurity atoms besides the dopant atoms. This forms the medium-grain size layer 32 which contains crystal grains having an average size of more than 50 nm and less than 100 nm. For example, the medium-grain size layer 32 is formed in such a manner as to have an average C-atom concentration of less than $1.4 \times 10^{21}/cm^3$.

In this first embodiment, the process steps of FIGS. 15 and 16 are then performed. The semiconductor device shown in FIG. 1 (and FIG. 18) is thus manufactured.

FIGS. 20A, 20B, 20C, and 20D are diagrams illustrating aspects of a grain size according to the first embodiment.

Figure 20A:
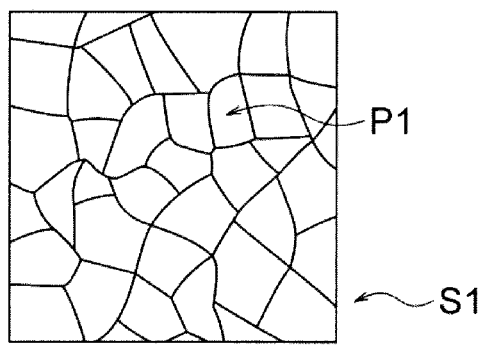
FIGS. 20A, 20B, 20C, and 20D are diagrams illustrating aspects of grain size according to a first embodiment.
Figure 20B:
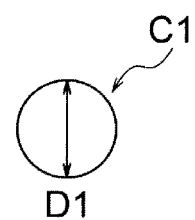

FIG. 20A shows a cross-section S1 of small-grain size layer 31. The symbol P1 of FIG. 20A denotes a particular crystal grain P1 in the cross-section S1. FIG. 20B depicts a circle C1 having the same area as the cross-section of the crystal grain P1. The symbol D1 denotes the diameter of the circle C1 corresponding to the crystal grain P1.

Figure 20C:
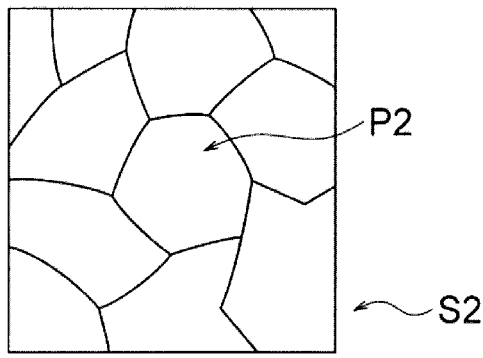
Figure 20D:
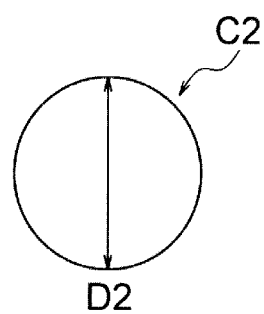

FIG. 20C shows a cross-section S2 of the medium-grain size layer 32. The symbol P2 of FIG. 20C denotes a particular crystal grain P2 in the cross-section S2. FIG. 20D depicts a circle C2 having the same area as the cross-section of the crystal grain P2. The symbol D2 denotes the diameter of the circle C2 corresponding to the crystal grain P2.

The size of the crystal grain P1 is expressed as the diameter D1 of the circle C1. The size of the crystal grain P1 can be calculated, for example, by obtaining an electron micrographic image of the cross-section S1 of the small-grain size layer 31, calculating the cross-sectional area of the crystal grain P1 in the cross-section S1 using the microscopic image, and calculating the diameter D1 from the cross-sectional area of the crystal grain P1. The cross-sectional area of the crystal grain P1 can be calculated, for example, from the number of pixels in the microscopic image corresponding to the crystal grain P1. Likewise, the size of the crystal grain P2 according to this first embodiment is expressed as the diameter D2 of the circle C2 and may be similarly calculated from a microscopic image.

In this first embodiment, the average size of crystal grains in the small-grain size layer 31 can be calculated by calculating the sizes of each individual crystal grain in the cross-section S1, and then calculating the average value of the grain sizes. In this first embodiment and in other embodiments, the average size of crystal grains in any other semiconductor layer can be calculated in the same manner as described. In general, references to grain sizes of particular layers or regions refer to the average grain size, as calculated according to the above, for that layer, region, or relevant portion thereof.

According to this first embodiment, the size of crystal grains in the semiconductor layer in contact with the channel semiconductor layer 12 can be made small by making the size of crystal grains in the intermediate semiconductor layer 3c smaller than the size of crystal grains in each of the lower semiconductor layer 3b and the upper semiconductor layer 3d. Therefore, it becomes possible to prevent grain boundaries S from being formed sparsely in the vicinity of the surface of the channel semiconductor layer 12, thereby making it possible to prevent deterioration of the performance of the semiconductor device caused by possible differences in the prevalence of grain boundaries S at the surface of the channel semiconductor layer 12.

Second Embodiment

Figure 21:
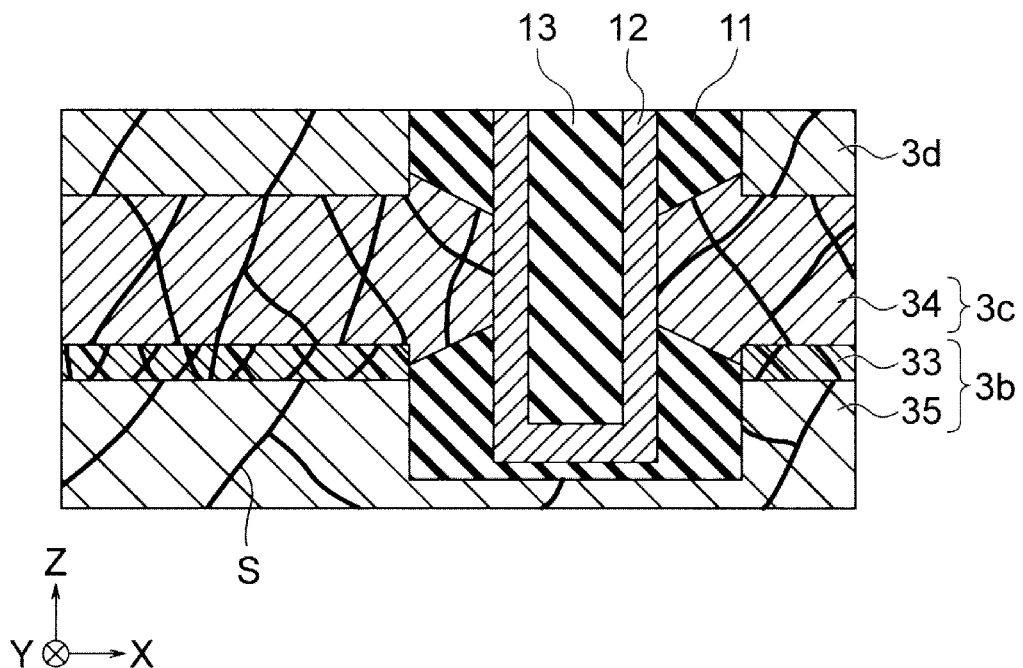
FIG. 21 is a cross-sectional view of a semiconductor device according to a second embodiment.

FIG. 21 is a cross-sectional view showing the structure of a semiconductor device according to a second embodiment.

The lower semiconductor layer 3b of this second embodiment is almost entirely composed of a large-grain size layer 35, and includes a small-grain size layer 33 formed on the upper surface of the large-grain size layer 35. The intermediate semiconductor layer 3c of this second embodiment is composed solely of a medium-grain size layer 34. The small-grain size layer 33 is between the lower surface of the medium-grain size layer 34 and the upper surface of the large-grain size layer 35. The structure of the upper semiconductor layer 3d of this second embodiment is the same as the structure of the upper semiconductor layer 3d of the first embodiment.

The structure of the large-grain size layer 35 and the structure of the upper semiconductor layer 3d according to this second embodiment are similar to the structure of the lower semiconductor layer 3b and the structure of the upper semiconductor layer 3d according to the first embodiment, respectively. Thus, for example, the large-grain size layer 35 and the upper semiconductor layer 3d each contain P atoms and C atoms, and the average concentration of C atoms in each of the large-grain size layer 35 and the upper semiconductor layer 3d is less than $1.4 \times 10^{21}/cm^3$. The average size of crystal grains in each of the large-grain size layer 35 and the upper semiconductor layer 3d is more than 100 nm.

The structure of the small-grain size layer 33 and the structure of the medium-grain size layer 34 according to this embodiment are similar to the structure of the small-grain size layer 31 and the structure of the medium-grain size layer 32 according to the first embodiment, respectively. Thus, for example, the small-grain size layer 33 contains P atoms and C atoms, and the average concentration of C atoms in the small-grain size layer 33 is more than $1.4 \times 10^{21}/cm^3$. For example, the medium-grain size layer 34 contains P atoms, and contains no or only a slight amount of C atoms, and the average concentration of C atoms in the medium-grain size layer 34 is less than $1.4 \times 10^{21}/cm^3$. The average size of crystal grains in the small-grain size layer 33 is less than 50 nm. The average size of crystal grains in the medium-grain size layer 34 is more than 50 nm and less than 100 nm.

Figure 22:
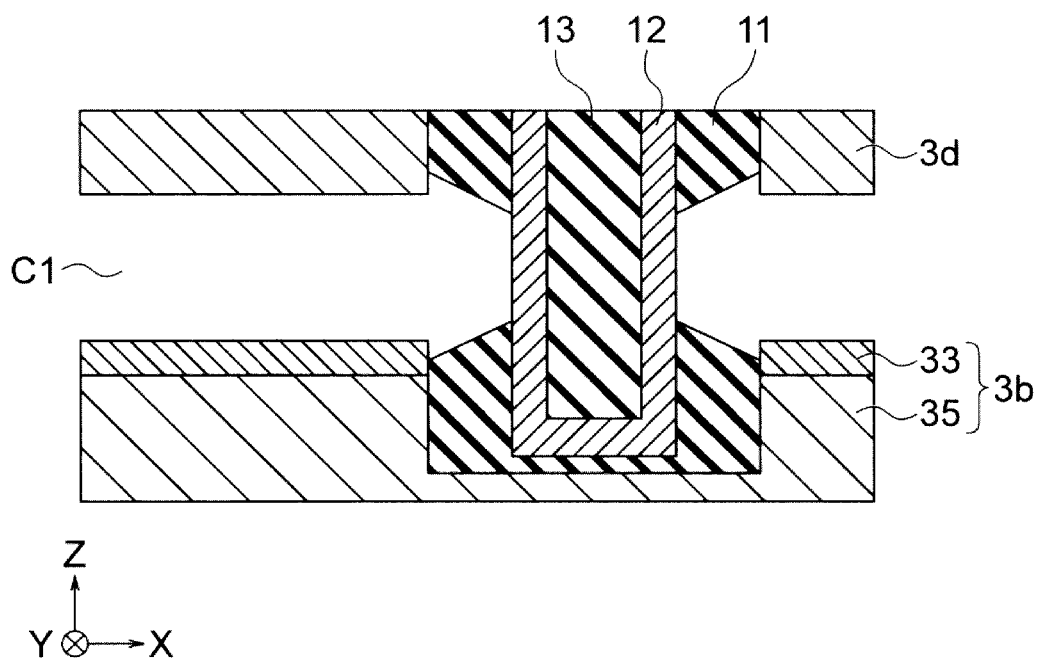
FIG. 22 is a cross-sectional view illustrating aspects of a manufacturing method for a semiconductor device according to a second embodiment.

FIG. 22 is a cross-sectional view illustrating a manufacturing method for the semiconductor device according to the second embodiment.

In this second embodiment, the process steps of FIGS. 3 through 13 are performed. The lower semiconductor layer 3b and the upper semiconductor layer 3d are formed in such a manner as to contain P atoms substantially no or very few C atoms. The lower semiconductor layer 3b and the upper semiconductor layer 3d, which both contain crystal grains having an average size of more than 100 nm, are thus formed. However, in the process step of FIG. 3, after the formation of the lower semiconductor layer 3b, before formation of additional layers, the upper surface of the lower semiconductor layer 3b is doped with C atoms in a high concentration (see FIG. 22). This forms a small-grain size layer 33 in the lower semiconductor layer 3b. The remainder (portion not doped with additional carbon) of the lower semiconductor layer 3b is composed of a large-grain size layer 35.

A medium-grain size layer 34 is ultimately formed in the cavity C1 on the surface of the small-grain size layer 33 and the structure shown in FIG. 21 is thus produced. The medium-grain size layer 34 is formed in such a manner as to contain P atoms and contain no or only a slight amount of C atoms. This forms the medium-grain size layer 34 which contains crystal grains having an average size of more than 50 nm and less than 100 nm.

In this second embodiment, the process steps of FIGS. 15 and 16 are then performed.

As described hereinabove, according to this second embodiment, the size of crystal grains in the semiconductor layer in contact with the channel semiconductor layer 12 can be made small by making the size of crystal grains in each of the small-grain size layer 33 and the medium-grain size layer 34 smaller than the size of crystal grains in each of the large-grain size layer 35 and the upper semiconductor layer 3d.

Third Embodiment

Figure 23:
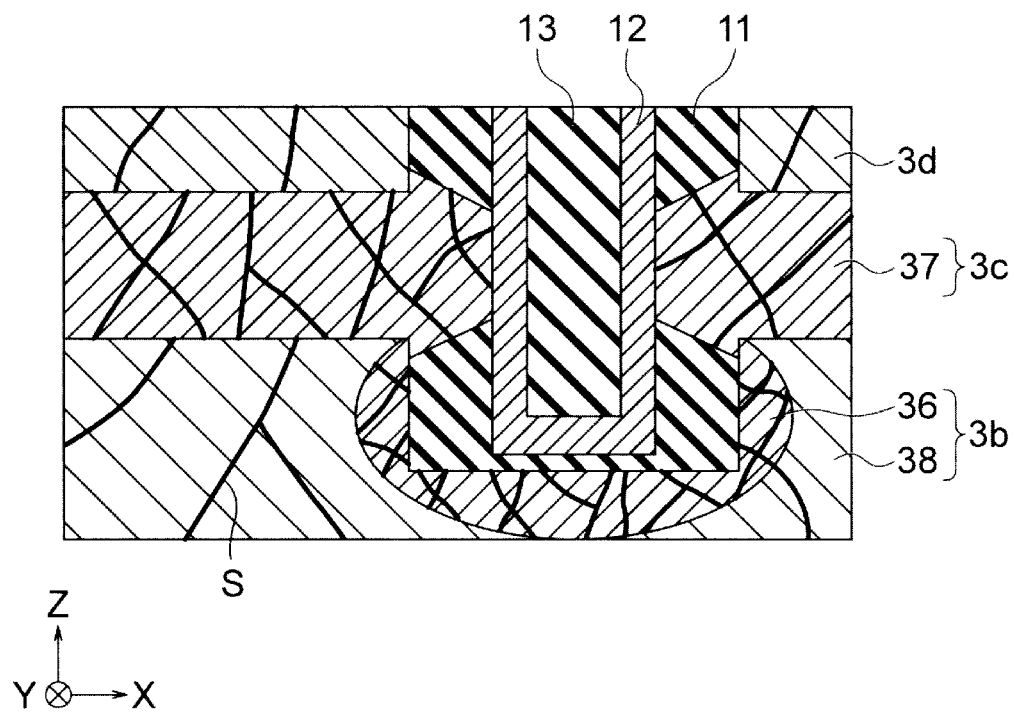
FIG. 23 is a cross-sectional view of a semiconductor device according to a third embodiment.

FIG. 23 is a cross-sectional view showing the structure of a semiconductor device according to a third embodiment.

The lower semiconductor layer 3b of this third embodiment is almost entirely composed of a large-grain size layer 38, but includes a small-grain size layer 36 formed on the upper surface of the large-grain size layer 38 at portions located below the memory insulating film 11, the channel semiconductor layer 12, and the core insulating film 13. The small-grain size layer 36 is formed between the upper surface of the large-grain size layer 38 and the lower surface of the memory insulating film 11. The intermediate semiconductor layer 3c of this third embodiment is composed solely of a medium-grain size layer 37. The structure of the upper semiconductor layer 3d of this third embodiment is the same as the structure of the upper semiconductor layer 3d of the first embodiment.

The structure of the large-grain size layer 38 and the structure of the upper semiconductor layer 3d according to this third embodiment are similar to the structure of the lower semiconductor layer 3b and the structure of the upper semiconductor layer 3d according to the first embodiment, respectively. Thus, for example, the large-grain size layer 38 and the upper semiconductor layer 3d each contain P atoms and C atoms, and the average concentration of C atoms in each of the large-grain size layer 38 and the upper semiconductor layer 3d is less than $1.4 \times 10^{21}/cm^3$. The average size of crystal grains in each of the large-grain size layer 38 and the upper semiconductor layer 3d is more than 100 nm.

The structure of the small-grain size layer 36 and the structure of the medium-grain size layer 37 according to this embodiment are similar to the structure of the small-grain size layer 31 and the structure of the medium-grain size layer 32 according to the first embodiment, respectively. Thus, for example, the small-grain size layer 36 contains P atoms and C atoms, and the average concentration of C atoms in the small-grain size layer 36 is more than $1.4 \times 10^{21}/cm^3$. For example, the medium-grain size layer 37 contains P atoms, and contains no or only a slight amount of C atoms, and the average concentration of C atoms in the medium-grain size layer 37 is less than $1.4 \times 10^{21}/cm^3$. The average size of crystal grains in the small-grain size layer 36 is less than 50 nm. The average size of crystal grains in the medium-grain size layer 37 is more than 50 nm and less than 100 nm.

Figure 24:
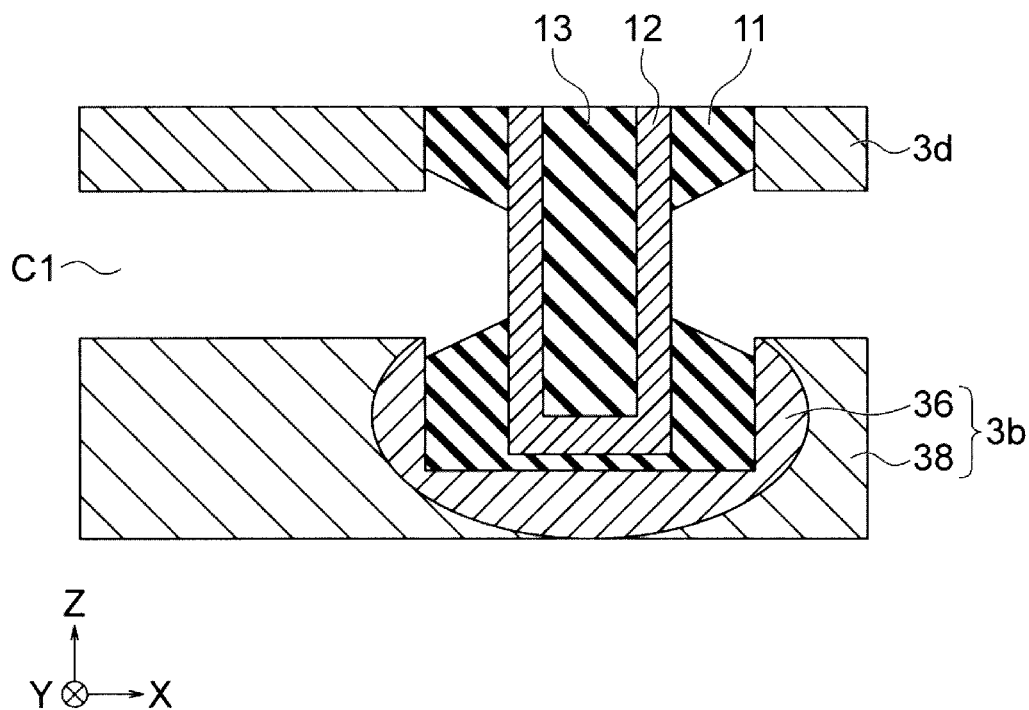
FIG. 24 is a cross-sectional view illustrating aspects of a manufacturing method of a semiconductor device according to a third embodiment.

FIG. 24 is a cross-sectional view illustrating a manufacturing method for the semiconductor device according to the third embodiment.

The process steps of FIGS. 3 through 13 are generally performed. The lower semiconductor layer 3b and the upper semiconductor layer 3d are formed in such a manner as to contain P atoms C atoms. This forms the lower semiconductor layer 3b and the upper semiconductor layer 3d which both contain crystal grains having an average size of more than 100 nm. However, in the process step of FIG. 5, after the formation of the memory holes MH, the upper surface of the lower semiconductor layer 3b, exposed in each memory hole MH, is doped with C atoms in a high concentration (see FIG. 24). This can form a small-grain size layer 36, containing crystal grains having an average size of less than 50 nm, in the lower semiconductor layer 3b. The remainder of the lower semiconductor layer 3b is composed of a large-grain size layer 38.

Next, a medium-grain size layer 37 is formed in the cavity C1 by forming it on the surface of the small-grain size layer 36. The structure shown in FIG. 23 is thus produced. The medium-grain size layer 37 is formed in such a manner as to contain P atoms and no or only a slight amount of C atoms. This forms the medium-grain size layer 37 which contains crystal grains having an average size of more than 50 nm and less than 100 nm.

In this third embodiment, the process steps of FIGS. 15 and 16 are then performed.

As described hereinabove, according to this third embodiment, the size of crystal grains in the semiconductor layer in contact with the channel semiconductor layer 12 can be made small by making the size of crystal grains in each of the small-grain size layer 36 and the medium-grain size layer 37 smaller than the size of crystal grains in each of the large-grain size layer 38 and the upper semiconductor layer 3$d$.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device, comprising:
   a first semiconductor layer which is an electrically-conductive polycrystalline semiconductor layer;
   a second semiconductor layer on the first semiconductor layer and which is an electrically-conductive polycrystalline semiconductor layer having a smaller average grain size than the first semiconductor layer;
   a plurality of electrode layers stacked on the second semiconductor layer at intervals in a first direction;
   a third semiconductor layer extending in the first direction through the first semiconductor layer, the second semiconductor layer, and each of the electrode layers and contacting the second semiconductor layer; and
   a charge storage layer between the plurality of electrode layers and the third semiconductor layer, wherein
   the second semiconductor layer includes a first region, which is a polycrystalline semiconductor layer having a first average grain size, and a second region, which is a polycrystalline semiconductor layer having a second average grain size which is larger than the first average grain size.

2. The semiconductor device according to claim 1, wherein the average grain size of the first semiconductor layer is more than 100 nm, and the average grain size of the second semiconductor layer is less than 100 nm.

3. The semiconductor device according to claim 1, wherein the first average grain size is less than 50 nm, and the second average grain size is more than 50 nm.

4. The semiconductor device according to claim 1, wherein the first region is between the second region and the first semiconductor layer.

5. The semiconductor device according to claim 1, wherein the second region is between the first region and the first semiconductor layer.

6. The semiconductor device according to claim 1, wherein the first region is between the second region and the third semiconductor layer.

7. The semiconductor device according to claim 1, wherein the first region is between an upper surface of the first semiconductor layer and a lower surface of the third semiconductor layer.

8. The semiconductor device according to claim 1, wherein the first region includes impurity atoms other than boron atoms, phosphorus atoms, or arsenic atoms.

9. The semiconductor device according to claim 1, wherein the first region includes carbon atoms or nitrogen atoms.

10. The semiconductor device according to claim 1, wherein the concentration of impurity atoms in the first region is more than $1.4 \times 10^{21}/\text{cm}^3$.

11. A semiconductor device, comprising:
    a first semiconductor layer;
    a second semiconductor layer on the first semiconductor layer and including impurity atoms other than boron atoms, phosphorus atoms, or arsenic atoms;
    a plurality of electrode layers stacked on the second semiconductor layer at intervals in a first direction;
    a third semiconductor layer extending in the first direction through the first semiconductor layer, the second semiconductor layer, and each of the electrode layers, and contacting the second semiconductor layer; and
    a charge storage layer between the plurality of electrode layers and the third semiconductor layer, wherein
    the second semiconductor layer includes a first region whose concentration of the impurity atoms is more than $1.4 \times 10^{21}/\text{cm}^3$ and a second region whose concentration of the impurity atoms is less than $1.4 \times 10^{21}/\text{cm}^3$.

12. The semiconductor device according to claim 11, wherein
    the first region is a polycrystalline semiconductor region having a first average grain size, and
    the second region is a polycrystalline semiconductor region having a second average grain size that is larger than the first average grain size.

* * * * *